(12) United States Patent
Boyapati et al.

(10) Patent No.: US 10,043,740 B2
(45) Date of Patent: Aug. 7, 2018

(54) PACKAGE WITH PASSIVATED INTERCONNECTS

(71) Applicants: Sri Ranga Sai Boyapati, Chandler, AZ (US); Rahul N. Manepalli, Chandler, AZ (US); Dilan Seneviratne, Chandler, AZ (US); Srinivas V. Pietambaram, Gilbert, AZ (US); Kristof Darmawikarta, Chandler, AZ (US); Robert Alan May, Chandler, AZ (US); Islam A. Salama, Chandler, AZ (US)

(72) Inventors: Sri Ranga Sai Boyapati, Chandler, AZ (US); Rahul N. Manepalli, Chandler, AZ (US); Dilan Seneviratne, Chandler, AZ (US); Srinivas V. Pietambaram, Gilbert, AZ (US); Kristof Darmawikarta, Chandler, AZ (US); Robert Alan May, Chandler, AZ (US); Islam A. Salama, Chandler, AZ (US)

(73) Assignee: Intel Coporation, Santa Clara, CA (US)

( * ) Notice: Subject to any disclaimer, the term of this patent is extended or adjusted under 35 U.S.C. 154(b) by 0 days.

(21) Appl. No.: 15/208,313

(22) Filed: Jul. 12, 2016

(65) Prior Publication Data

US 2018/0019197 A1    Jan. 18, 2018

(51) Int. Cl.
*H01L 23/48* (2006.01)
*H01L 23/498* (2006.01)
(Continued)

(52) U.S. Cl.
CPC .... *H01L 23/49838* (2013.01); *H01L 21/0217* (2013.01); *H01L 21/02274* (2013.01);
(Continued)

(58) Field of Classification Search
CPC ......... H01L 23/49838; H01L 23/49827; H01L 23/49866; H01L 23/49894; H01L 23/49822
(Continued)

(56) References Cited

U.S. PATENT DOCUMENTS

| 2004/0188837 A1* | 9/2004 | Kim | H01L 23/481 |
| | | | 257/738 |
| 2006/0178002 A1 | 8/2006 | Kim et al. | |

(Continued)

OTHER PUBLICATIONS

International Search Report and Written Opinion for PCT Application No. PCT/US2017/038656, dated Sep. 21, 2017, 14 pages.

*Primary Examiner* — Anthony Ho
(74) *Attorney, Agent, or Firm* — Eversheds Sutherland (US) LLP

(57) ABSTRACT

Semiconductor packages with interconnects having passivation thereon is disclosed. The passivation layer may be any suitable dielectric material that may overlie a build-up dielectric layer and metal traces of an interconnect layer in a semiconductor package. Via holes may be formed in the build-up dielectric and the passivation layer may be removed from the bottom of the via hole. By removing the passivation layer at the bottom of the via hole, any residual build-up dielectric may also be removed from the bottom of the via hole. Thus removal of the residual build-up dielectric may not require a desmear process that would otherwise roughen metal and/or dielectric surfaces. The resulting smoother metal and/or dielectric surfaces enabled by the use of the passivation layer may allow greater process latitude and/or flexibility to fabricate relatively smaller dimensional interconnect features and/or relatively improved signaling frequency and integrity.

20 Claims, 7 Drawing Sheets

(51) Int. Cl.
*H01L 21/02* (2006.01)
*H01L 21/48* (2006.01)
*H01L 23/00* (2006.01)
*H01L 25/065* (2006.01)

(52) U.S. Cl.
CPC ........ *H01L 21/486* (2013.01); *H01L 21/4857* (2013.01); *H01L 23/49822* (2013.01); *H01L 23/49827* (2013.01); *H01L 23/49866* (2013.01); *H01L 23/49894* (2013.01); *H01L 24/17* (2013.01); *H01L 25/0655* (2013.01); *H01L 2224/13147* (2013.01); *H01L 2224/16227* (2013.01); *H01L 2224/16235* (2013.01); *H01L 2924/01022* (2013.01); *H01L 2924/01027* (2013.01); *H01L 2924/01028* (2013.01); *H01L 2924/01042* (2013.01); *H01L 2924/01073* (2013.01); *H01L 2924/01074* (2013.01); *H01L 2924/04642* (2013.01); *H01L 2924/04941* (2013.01); *H01L 2924/04953* (2013.01); *H01L 2924/059* (2013.01); *H01L 2924/05042* (2013.01); *H01L 2924/05442* (2013.01); *H01L 2924/15311* (2013.01)

(58) Field of Classification Search
USPC .......................................................... 257/753
See application file for complete search history.

(56) References Cited

U.S. PATENT DOCUMENTS

| | | |
|---|---|---|
| 2008/0122078 A1 | 5/2008 | He et al. |
| 2010/0165585 A1* | 7/2010 | Lin ....................... H01L 23/642 361/748 |
| 2013/0127024 A1 | 5/2013 | Lin et al. |
| 2014/0048939 A1 | 2/2014 | Park et al. |
| 2015/0061073 A1 | 3/2015 | Kim et al. |
| 2016/0056226 A1* | 2/2016 | Song ................... H01L 23/5227 257/528 |

* cited by examiner

PACKAGE WITH PASSIVATED INTERCONNECTS

TECHNICAL FIELD

This disclosure generally relates to semiconductor packages, and more particularly to a package with passivated interconnects.

BACKGROUND

Integrated circuit(s) and other electronic devices may be packaged on a semiconductor package. The semiconductor package may be integrated onto an electronic system, such as a consumer electronic system. The package may include any number of metallic signal traces or interconnects. The surfaces of these interconnects are often roughened, particularly during aggressive desmearing processes, to ensure relatively good metal seed adhesion of subsequent metal interconnects.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1:
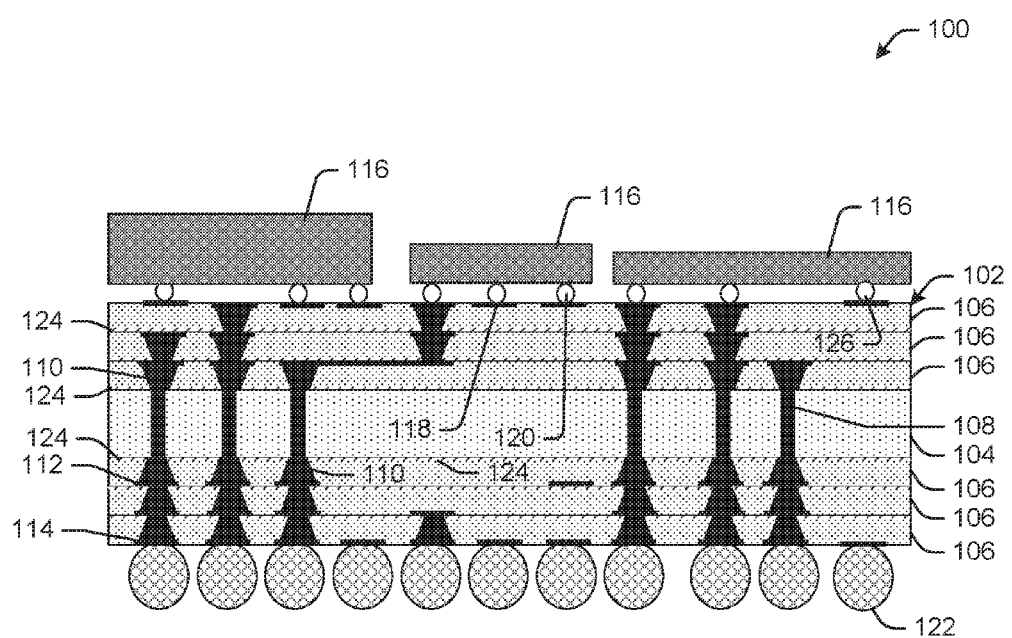
FIG. 1 depicts a simplified cross-sectional schematic diagram illustrating an example configuration of a semiconductor package having passivated interconnects, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

In accordance with example embodiments of the disclosure, semiconductor packages with passivated interconnects may be formed. In some example embodiments, a passivation layer may enable a relatively higher density of interconnect traces on the semiconductor package. The use of passivation layer overlying metal traces may eliminate, in example embodiments, the use of desmear and/or copper roughening processes of semi-additive process to build an overlying via and/or metallic trace. Desmear processes may generally roughen underlying surrounding dielectric materials. Copper selective etching processes may be used to increase surface area of copper to facilitate mechanical adhesion to subsequent dielectric films. Thus, by removing the desmear and/or copper roughening processes in fabricating semiconductor package interconnects such as high density interconnects, a reduced level of metal and/or dielectric roughening may be realized. In example embodiments, the reduced level of metal roughening and/or dielectric roughening may enable the formation of relatively higher density interconnects on a semiconductor package. Reduced levels of metal and dielectric roughening may also result in reduction of insertion loss of high frequency electrical signals transmitted through the package.

According to example embodiments of the disclosure, of passivation layer may be provided overlying a metal trace upon which an overlying via is to be formed. Build-up layer dielectric may be disposed overlying the metal trace and the passivation layer thereon. The build-up layer dielectric may be disposed by any suitable mechanism, such as lamination. After an overlying build-up layer dielectric is provided, via holes may be defined, such as by laser ablation or any other suitable mechanism. In accordance with example embodiments of the disclosure, the via holes may be cleaned by performing an etch of the passivation layer that is exposed, at least partially, at the bottom of the via holes. At this point, the passivation layer may remain in regions where vias have not been formed in the overlying build-up dielectric. Thus, the passivation layer may overlie a build-up layer dielectric and/or metal traces formed thereon except for the portions where vias have been formed in an overlying build-up dielectric.

In some example embodiments, the passivation film may be any suitable film, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, of the like. The passivation films may be deposited by any suitable mechanism, including plasma enhanced chemical vapor deposition (PECVD), chemical vapor deposition (CVD), spin-on processes, spray coating processes, physical vapor deposition (PVD), combinations thereof, or the like. In some example embodiments, the passivation film may be a silicon nitride film of a thickness in the range of about 20 nanometers to about 1 micron, such as at a thickness of 200 nm, deposited over a build-up dielectric and metal traces formed in and/or on the build-up dielectric. The silicon nitride passivation film may be deposited by a PECVD system, such as with silane/ammonia ($SiH_4/NH_3$) based feed gas in a microwave plasma, such as a downstream plasma system. Alternatively, the silicon nitride passivation film may be formed in any suitable plasma CVD system, such as capacitively-coupled plasma, inductively-coupled plasma, high density plasma, magnetically enhanced plasma, etc.

A removal, such as an etch process, of the passivation layer may be performed, instead of a desmear process, to remove the passivation layer that is exposed at the bottom of the via hole. By etching the passivation layer, residual build-up dielectric may be removed and a relatively smoother metal surface may remain compared to if a desmear process is performed. The etching of the passivation layer may also result in a relatively smoother dielectric surface, in some example embodiments, relative to if a desmear process is performed. The relatively smoother dielectric surface may be realized on the sidewalls of the via and/or a top surface of the build-up dielectric. The passivation layer removal process may be any suitable removal process, such as a wet etch and/or a dry etch process. In some example embodiments, the passivation layer may be etched using a permanganate etch solution, a phosphoric acid solution, or indeed any suitable etch for removal of the passivation layer.

In example embodiments, having a relatively lower surface roughness of underlying build-up dielectric material and/or metal may enable tighter pitches of overlying vias and/or metal traces. In some example embodiments, the use of a passivation layer overlying metal traces and build-up dielectric materials, as disclosed herein, may result in root mean square surface roughness of approximately less than 100 nm on metal traces, such as copper traces, and approximately less than 40 nm on build-up dielectric, such as Ajinomoto build-up films (ABF) build-up dielectric or any other suitable build-up dielectrics. In some example embodiments, the mechanisms and structures as disclosed herein, may enable relatively more uniform surface roughness of metal traces and/or build-up dielectrics, relative to mechanisms and structures without the passivation film and using desmear processes. Such relatively low levels of surface roughness may allow for the fabrication of high density interconnects (HDI) with relatively tighter pitches of metal traces compared to conventional interconnect fabrication processes and structures.

After the passivation layer is removed from the bottom of a via hole, an adhesion layer may be deposited. The adhesion layer may promote adhesion of subsequent plated metal in the via and metallic traces, such as those formed by a semi-additive process, to metal traces at the bottom of the via holes and/or build-up dielectrics. The adhesion layer may be deposited by any suitable process, such as plasma enhanced chemical vapor deposition (PECVD). Alternatively, the adhesion layer may be deposited by any other suitable process, such as physical vapor deposition (PVD), chemical vapor deposition (CVD), atomic layer deposition (ALD), combinations thereof, or the like. The adhesion layer deposition process, in example embodiments, may be optimized to provide a relatively low temperature process (e.g., temperatures compatible with underlying build-up materials). In example embodiments, the adhesion layer deposition process may further be optimized to provide a conformal coverage of the adhesion layer within the via hole and over the surface of the underlying build-up dielectric layer. The adhesion layer may be any suitable material, including, for example, titanium, tantalum, tungsten, molybdenum, titanium nitride, tantalum nitride, cobalt, cobalt-tungsten-boron, alloys of the aforementioned, combinations thereof, or the like.

A metal seed layer may be deposited over the adhesion layer, in example embodiments. The metal seed layer may be deposited by any suitable mechanism, such as a sputtering process. The metal seed in some example embodiments, may be deposited by PVD, CVD, evaporation, ALD, combinations thereof, or the like. The metal seed layer may be copper, cobalt, aluminum, combinations thereof, or the like.

After the seed layer is deposited, vias and/or metal layers may be formed overlying the underlying metal trace and/or underlying build-up layer. This may be performed by a semi-additive process, or any other suitable process. For example, photoresist or other masking material may be provided, such as by lamination, and patterned and then metal layers may be electroplated in the portions that may be exposed in the photoresist or other masking material. These exposed portions may provide a current path between the deposited seed layer and an electroplating solution in which the package substrate is selectively plated. As a result, metal may be plated in these exposed regions. The electroplating process may electroplate copper, cobalt, nickel, combinations thereof, or any other suitable metal, alloy thereof, or the like. After electroplating via and metal trace(s), the photoresist or other masking material may be stripped off of the surface of the packaging substrate on which the interconnect structure with passivated material and/or high density interconnect (HDI) is fabricated.

Subsequent layer(s) of interconnect may be fabricated by the processes as described above. It will be appreciated that the reduced roughness may be achieved by using the passivation layer for cleaning the bottom of the via holes, such as by a passivation etch process, rather than using a desmear process. As a result, the reduced levels of roughness may enable relatively higher process latitude in fabrication of tighter dimensional (e.g., smaller line width and/or smaller space between lines) HDI on upper layers of interconnect (e.g., interconnect layers overlying the interconnect layer with the passivation film) of a semiconductor package.

In accordance with example embodiments of the disclosure, the semiconductor package with passivation films may have any suitable number of build-up dielectric layers, some or all of which may have the passivation film thereon. Thus, some or all of the interconnects formed on the build-up layers of the semiconductor package, according to example embodiments, may be formed without the use of the desmear process. In some cases, the last layer of interconnects (e.g., the top layer of interconnect) on the semiconductor package may be a solder mask layer on which electronic components may be assembled. In other cases, electronic components may be assembled on the last layer of interconnect. In some example embodiments, there may be a core with a symmetric number of build-up dielectric layers on either side of the core. In other example embodiments, there may be an asymmetric number of build-up layers on either side of the core. In yet further example embodiments, a coreless integration may be used, where there is no core layer in the semiconductor package. The one or more electrical components may be of any suitable type, such as integrated circuit (IC) dies, radio frequency ICs (RFICs), surface mount devices (SMDs), connectors, passive components, active components, etc.

According to example embodiments, the semiconductor package may include a substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. The build-up layers, as built up on the core, may have interconnects formed therein. The interconnects may provide electrical pathways for signals between electronic components (e.g., integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like. The build-up layers may be fabricated on one or both sides of the package core. In some cases, there may be the same number of build-up layers on both sides of the package core. In other cases, the build-up layers formed on either side of the package core may be asymmetric. Furthermore, the core of the semiconductor package may have a plurality of through vias to make electrical connections from one side of the core to the other side of the core. Thus, through vias in the core may allow electrical connections between one or more build-up layers on the top of the semiconductor package to one or more build-up layers on the bottom of the semiconductor package. In some alternative embodiments, a coreless substrate may be used for the semiconductor package with passivated traces.

The one or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the dies (e.g., integrated circuits) that are packaged in the semiconductor package, as described herein, may have input/output (I/O) connections for various sizes. For example, a particular die may have finer pitch I/O connections than another die packaged on the semiconductor package. In some example embodiments, the build-up layers on the bottom of the core may have one or more input/output (I/O) connections between the semiconductor package and a board. In other example embodiments, build-up layers on the top of the semiconductor package may have one or more package-to-board interconnects. Semiconductor package-to-board level interconnects may be provided on one or both sides of the package substrate. In example embodiments, the semiconductor package-to-board level interconnects may be ball grid array (BGA) connections, other area connections, periphery connections, or the like.

FIG. 1 depicts a simplified cross-sectional schematic diagram illustrating an example configuration of a semiconductor package 100 having passivated interconnects 112, in accordance with example embodiments of the disclosure.

The semiconductor package 100 may include a package substrate 102 with a core 104 having one or more through-vias 108, and one or more build-up layers 106 disposed thereon. The build-up layers 106 may have one or more vias 110 and/or metallic traces 112, 114, 118 formed therein to route signals, ground, and/or power throughout the semiconductor package 100. A top build-up layer 110 may have one or more pads 118 thereon onto which die(s) 116 with die-to-package interconnects 120, 126 may be connected. The semiconductor package 100 may further have pads on a bottom build-up layer 114 which may be used to interface with package-to-board interconnects 122. Some of the metallic traces 112 may be at least partially covered by a passivation layer 124, in accordance with example embodiments of the disclosure. Other metallic traces, such as in the form of bond pads 114, 118 may not have passivation layers formed thereon. As shown, the passivation layers may be opened, or otherwise removed in regions where a via 110 makes contact with an underlying metallic trace 112.

In example embodiments, the semiconductor package substrate 102 may be fabricated in a batch and/or bulk fashion, where multiple semiconductor package substrates 102 may be fabricated at one time. In other words, the semiconductor package substrate 102 may be singulated into separate semiconductor package substrates 102 after completing other fabrication processes in a batch fashion with other package substrates on a common panel. The package core 104 may be of any suitable size and/or shape. For example, the package core 104, in example embodiments, may be a rectangular panel. In example embodiments, the core 104 may be fabricated of any suitable material, including polymer material, ceramic material, plastics, composite materials, glass, epoxy laminates of fiberglass sheets, FR-4 materials, FR-5 materials, combinations thereof, or the like. The core 104 may have any suitable dielectric constant (k-value) and/or leakage current characteristics. It will be appreciated that in some alternative embodiments, a coreless integration may be used, where there is no core layer, but instead, only routing layers such as those formed in the build-up layers 106. The metal traces with passivation layers 124 thereon, may be implemented on a coreless integration in a similar way and/or with similar advantages, as described herein with reference to a core-based semiconductor package 100.

The core 104 may have through vias 108 formed therein. Through vias 108 may be used for propagating electrical signals from the top of the package core 104 to the bottom of the package core 104, and vice versa. The through vias 108 may be formed by a process of forming though holes in a core substrate, such as by laser ablation or any other suitable process, and subsequently filling those through holes, such as by electroplating or any other suitable process.

The build-up layers 106 may have dielectric materials and electrical connections 110, 112, 114, 118 (e.g., vias, pads, traces, etc.) thereon. The semiconductor package 100 bond pads 114, 118, in some non-limiting examples, may have a relatively greater area compared to other electrical connections 110, 112.

The build-up layers 106 or interconnect layer may be formed by a variety of suitable processes. Dielectric material may be laminated on the semiconductor package core 104 and/or underlying build-up layers 106. In example embodiments, the dielectric laminate may be any suitable material, including polymer material, ceramic material, plastics, composite materials, liquid crystal polymer (LCP), epoxy laminates of fiberglass sheets, prepreg, FR-4 materials, FR-5 material, ABF, combinations thereof, or the like. In some example embodiments, the package core 104 and the build-up dielectric material 106 may be the same type of material. In other example embodiments, the package core 104 and the build-up dielectric material 106 may not be constructed of the same material type. Vias 110 and/or trenches 112, 114, 118 in the build-up layers 106, may be formed by any suitable mechanism, such as a semi-additive process (SAP). Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively, within the build-up layer 106. The vias and trenches may then be filled with metal, such as by electroless metal plating, electrolytic metal plating, physical vapor deposition, combinations thereof, or the like. Resist may then be stripped and seed layer etched, to form the metal pattern.

Although the semiconductor package substrate 102 is shown with six layers of interconnect (e.g., three build-up layers 106 on either side of the core 104), it will be understood that there may be any suitable number of interconnect layers. It will further be appreciated that the number of build-up layers on either side of the core 104 may be asymmetric in some cases. The build-up layers may be of any suitable material properties (e.g., k value, leakage properties, etc.) and thicknesses. For example, relatively low-k pre-preg layers may be used in the semiconductor package substrate 102 to allow for high-frequency, low signal degradation signaling. In example embodiments, build-up layers 106 may include laminate dielectric layers with a thickness in the range of about 25 microns (μm) to about 100 μm and metal layers in the range of about 10 μm to about 40 μm.

In some example embodiments, the passivation layers 124 may be any suitable film, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, of the like. The passivation layers 124 may be deposited by any suitable mechanism on an underlying build-up dielectric 106 and/or metal traces 112, PECVD, CVD, spin-on processes, spray coating processes, PVD, ALD, combinations thereof, or the like. In some example embodiments, the passivation layers 124 may include a silicon nitride film of a thickness in the range of about 20 nanometers to about 1 micron, such as at a thickness of 200 nm, deposited over the build-up dielectric 106 and metal traces 112 formed in and/or on the build-up dielectric 106.

In some example embodiments, passivation layers 124 may be provided on every level of build-up interconnects. In alternate embodiments, passivation layers 124 may only be used on some levels of build-up interconnects. For example, in a particular implementation, passivation layers may be utilized under a build-up layer to be fabricated with relatively tighter dimensions (e.g., smaller pitch, smaller line size, smaller space, etc.) and a desmear-based process may be used for build-up interconnect levels that may have relatively looser dimensions of vias and/or metallic traces.

In some example embodiments, the passivation layers 124 overlying each of the build-up dielectrics 106 may be substantially similar. In other words, the composition, thickness, and/or other features of the passivation layers 124 may be similar for all of the passivation players of the semiconductor substrate 102. In other example embodiments, the composition and/or thickness of the passivation layer may vary for some or all of the passivation layers 124 from one level to the next.

The electrical components 116, such as in the form of die(s), may be attached by any suitable mechanism. The die 120 may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like. The die 120 may be electrically and mechanically coupled to the corresponding pads 118 of the semiconductor package 102 via any suitable die-to-package interconnect 122, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the type of contact may be different for dies mounted on the semiconductor package 102. For example, one die may have copper pillar contacts and another die may have solder bump contacts. In other example embodiments, different dies mounted on the semiconductor package 102 may have the same type of contacts (e.g., all dies have copper pillar contacts). In some cases, underfill (e.g., with or without filler materials) may be provided between the die 120 and the semiconductor package 102, such as surrounding die-to-package interconnects 122. In some cases, the die-to-package interconnect 120 may be of a similar type and dimension as the die-to-package interconnect 126.

In some example embodiments, underfill (not shown) may be provided between the semiconductor package substrate 102 and the one or more electrical components 116. The underfill may surround the contacts 120, 126, and/or pads 118. Underfill epoxy may be dispensed by a nozzle under and/or adjacent to the electrical components 116 on the semiconductor package 102. The underfill epoxy may move by capillary action and/or Van der Waals forces under the one or more electrical components 116. In some example embodiments, a mold compound (not shown) may be provided on the surface of the semiconductor packaging substrate 102 using any suitable mechanism, including, but not limited to, liquid dispense, spin coating, spray coating, combinations thereof, or the like. In some example embodiments, the molding compound may encapsulate the one or more electrical components 116. In some example embodiments, molding compound may be provided within an EMI shield or lid that may be provided over the one or more electrical components 116.

The package-to-board interconnects 122 may be of any suitable type including, for example, ball grid array (BGA), land grid array (LGA), or any other suitable package-to-board interconnect. In some alternate embodiments, non-grid array package-to-board interconnects 122 may be used, such as a dual-inline pin (DIP), wedge bonds, or indeed, any other suitable package-to-board connection.

Figure 2:
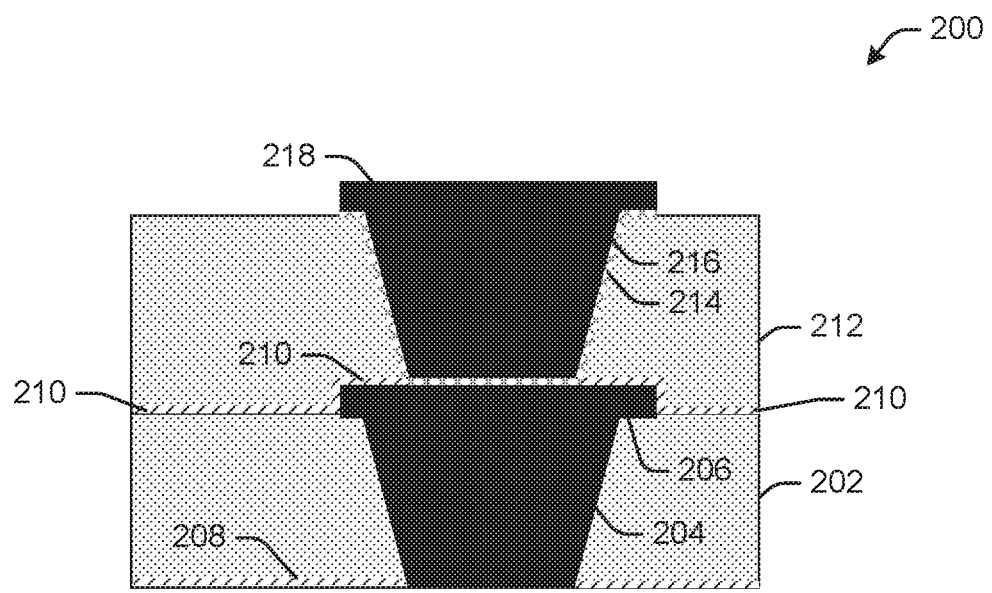
FIG. 2 depicts a simplified cross-sectional schematic diagram illustrating an example passivated interconnect structure of the semiconductor package of FIG. 1, in accordance with example embodiments of the disclosure.

FIG. 2 depicts a simplified cross-sectional schematic diagram illustrating an example passivated interconnect structure 200 of the semiconductor package 100 of FIG. 1, in accordance with example embodiments of the disclosure. In example embodiments, the interconnect structure 200 may be part of the build-up layer interconnects of a semiconductor package substrate with passivation layer, in accordance with embodiments of the disclosure, such as the semiconductor package 100 of FIG. 1.

The passivated interconnect structure 200 may include an underlying build-up dielectric with a via 204 formed therein and electrically connected to a metallic trace 206 formed over the build-up dielectric 202. The build-up dielectric may, optionally, be disposed over a passivation layer 208. The passivation layer 208 may be provided during and/or for the fabrication of any underlying metal interconnect layer under the build-up dielectric 202.

The build-up dielectric 202, as described above, may be any suitable material, such as ABF, pre-preg, FR-4, LCP, etc. The via 204 may be any suitable material, such as, for example copper. Similarly, the metal trace 206 may be any suitable material, such as, for example, copper. In some cases, the via 204 and the metal trace 206 may be fabricated in a seamless manner, such as by a semi-additive process (SAP). Therefore, in example embodiments, no interfaces and/or seams may be readily detectable between the via 204 and metal trace 206. In alternative embodiments, separate processes may be used to fabricate the via 204 and the metallic trace 206, and, as a result, a seam (e.g., grain boundaries) may be observed between the two elements 204, 206.

A passivation layer 210 may be disposed overlying the build-up dielectric 202 and the metallic trace 206, in accordance with example embodiments of the disclosure. A second build-up dielectric layer 212 may be disposed over the passivation layer 210, and via 216 may be formed in the build-up dielectric 212 and a second metallic trace 218 may be formed over the build-up dielectric 212. The passivation layer 210 may only overlie the portions of the metallic trace 206 that is not open to the via 216 disposed over the metallic trace 206. There may be an adhesion layer 214 disposed between metal of the via 216 and the metallic trace 218 and metal of the underlying metallic trace 206 and the build-up dielectric 212. The adhesion layer 214 may promote adhesion between the via 216 and the build-up dielectric 212 and/or between the metallic trace 218 and the build-up dielectric 212.

In some example embodiments, the passivation layer 210 may be any suitable film, such as silicon nitride, silicon dioxide, silicon oxynitride, silicon carbonitride, silicon carbide, silicon oxycarbonitride, spin-on silicate glass films, silipolymeric dielectric films, non-stoichiometric variations of the aforementioned films, combinations thereof, of the like. The passivation layer 210 may be of any suitable thickness. In some example embodiments, the passivation layer 210 may approximately be a thickness in the range of about 20 nanometers to about 1 micron, such as at a thickness of 200 nm. The passivation layer 210 may be of any suitable density and/or porosity. Furthermore, the passivation layer may be of any suitable conformality.

The adhesion layer 214 may promote adhesion of subsequent plated metal in the via 216 and metallic trace 218 to metal trace 206 and/or the build-up dielectric 212. In example embodiments, the adhesion layer deposition process may further be optimized to provide a conformal coverage of the adhesion layer within the via hole and over the surface of the underlying build-up dielectric layer. The adhesion layer 214 may be any suitable material, including, for example, titanium, tantalum, tungsten, molybdenum, titanium nitride, tantalum nitride, cobalt, cobalt-tungsten-boron, alloys of the aforementioned, combinations thereof, or the like. The thickness of the adhesion layer 214 may be any suitable thickness. In some example embodiments, the thickness of the adhesion layer 214 may be in the range of about 5 nm to about 1 micron.

FIGS. 3A-3H depict simplified cross-sectional schematic diagrams of example interconnects with passivation during processing, in accordance with example embodiments of the disclosure.

Figure 3A:
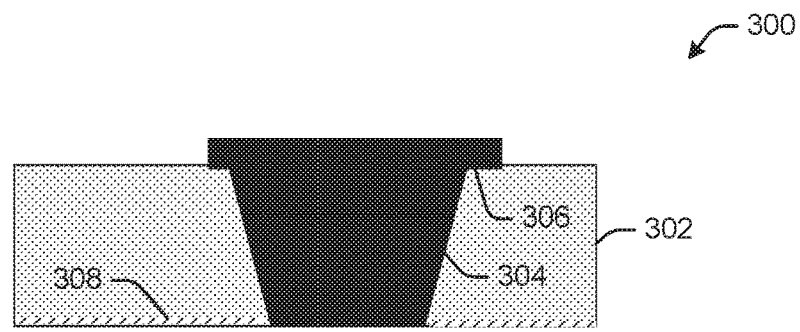
FIGS. 3A-3H depict simplified cross-sectional schematic diagrams of example interconnects with passivation during processing, in accordance with example embodiments of the disclosure.

FIG. 3A depicts a simplified cross-sectional schematic diagram of an example interconnect structure 300, in accordance with example embodiments of the disclosure. The interconnect may include a build-up dielectric 302 with a via 304 and a metal traces 306 formed therein/thereon. Optionally, the build-up dielectric 302 may overlie a passivation layer 308, in accordance with example embodiments of the disclosure. The passivation layer 308 may be provided during and/or for the fabrication of any underlying metal interconnect layer under the build-up dielectric 302.

The build-up dielectric 302, as described above, may be any suitable material, such as ABF, pre-preg, FR-4, LCP, etc. The via 304 may be any suitable material, such as, for example copper. Similarly, the metal trace 306 may be any suitable material, such as, for example, copper. In some cases, the via 304 and the metal trace 306 may be fabricated in a seamless manner, such as by a semi-additive process (SAP). Therefore, in example embodiments, no interfaces and/or seams may be readily detectable between the via 304 and metal trace 306. In alternative embodiments, separate processes may be used to fabricate the via 304 and the metallic trace 306, and, as a result, a seam (e.g., grain boundaries) may be observed between the two elements 304, 306.

The build-up layer 302 may be formed on an underlying build-up layer and/or package core and/or temporary substrate (e.g., in a coreless integration) using any suitable mechanism. In example embodiments, the build-up layer 302 may be in the form of a sheet and may be laminated onto an underlying material, such as by applying heat and pressure (e.g., by heated rollers, etc.).

Figure 3B:
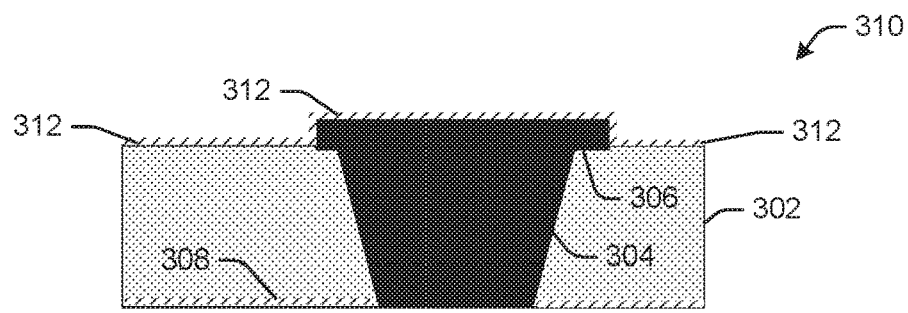

FIG. 3B depicts a simplified cross-sectional schematic diagram of an example interconnect structure 310 with a passivation layer 312 formed over the build-up dielectric 302 and metallic trace 306, in accordance with example embodiments of the disclosure.

In some example embodiments, the passivation film may be any suitable film, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, of the like. The passivation films may be deposited by any suitable mechanism, including plasma enhanced chemical vapor deposition (PECVD), chemical vapor deposition (CVD), spin-on processes, spray coating processes, physical vapor deposition (PVD), combinations thereof, or the like. In some example embodiments, the passivation film may be a silicon nitride film of a thickness in the range of about 20 nanometers to about 1 micron, such as at a thickness of 200 nm, deposited over a build-up dielectric and metal traces formed in and/or on the build-up dielectric. The silicon nitride passivation film may be deposited by a PECVD system, such as with silane/ammonia ($SiH_4/NH_3$) based feed gas in a microwave plasma, such as a downstream plasma system. Alternatively, the silicon nitride passivation film may be formed in any suitable plasma CVD system, such as capacitively-coupled plasma, inductively-coupled plasma, high density plasma, magnetically enhanced plasma, etc. In other example embodiments, any variety of other feed gases may be used including, but not limited to, nitrous oxide, carbon dioxide, argon, helium, neon, nitrogen, oxygen, methylsilane, dimethylsilane, trimethylsilane, tetramethylsilane, tetraethyl orthosilicate, combinations thereof, or the like.

Figure 3C:
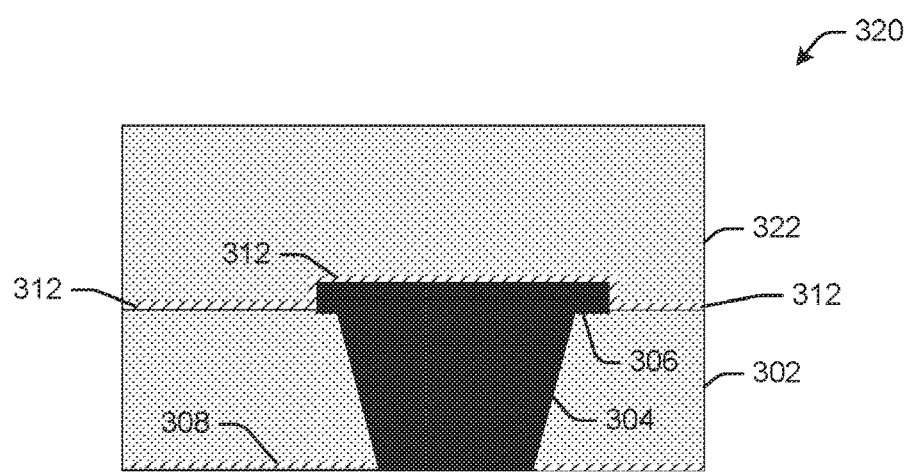

FIG. 3C depicts a simplified cross-sectional schematic diagram of an example interconnect structure 320 with a build-up dielectric 322 formed over the passivation layer 312, in accordance with example embodiments of the disclosure.

The build-up layer 322 may be formed on the underlying build-up dielectric 302 and/or passivation layer 312 using any suitable mechanism. In example embodiments, the build-up layer 322 may be in the form of a sheet and may be laminated onto an underlying material, such as by applying heat and pressure (e.g., by heated rollers, etc.).

In some example embodiments, the build-up layer 322 may include one or more elements that may improve the selectivity of a subsequent passivation film removal to the build-up film removal. In some example embodiments, other filler materials and/or resins may be included in build-up layer 322 to enhance adhesion of a subsequent adhesion metal deposited over the build-up dielectric. These build-up dielectric 322 additives may include silica particles that may reduce the CTE of the build-up dielectric, phenoxy resins, polyimides, polyacetate resins, or the like to enhance surface adhesion to metal, and/or block copolymers with varying aliphatic group chains lengths for improved selectivity to plasma etch removal of the passivation layer 312.

Figure 3D:
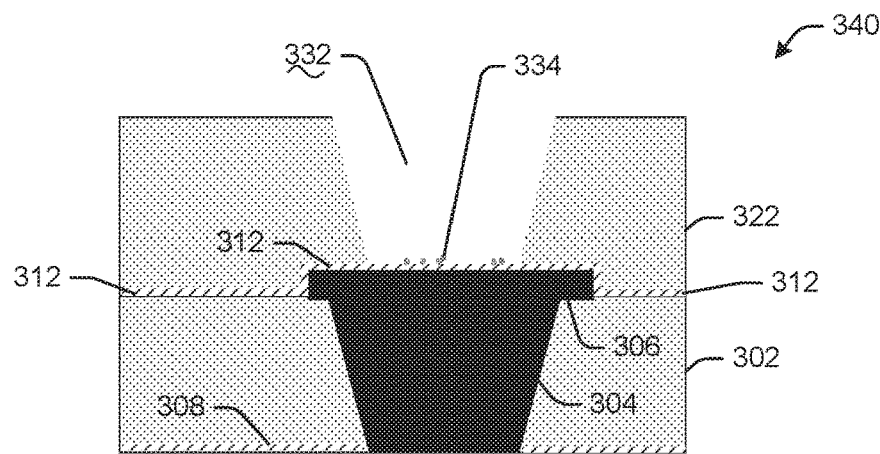

FIG. 3D depicts a simplified cross-sectional schematic diagram of an example interconnect structure 340 with a via hole 332 formed within the build-up dielectric 322, in accordance with example embodiments of the disclosure.

In example embodiments, the via holes in the build-up dielectric 322 may be formed such that the bottom of the via holes 332 open up to the underlying passivation layer 312 overlying the metal trace 306. The via hole may be formed by any suitable mechanism including, but not limited to, laser ablation, wet etching, dry etching, embossing, combinations thereof, or the like. In some example embodiments, multiple processes in succession may be used to form the via hole. For example, a laser ablation process followed by a dry etch process may be used. In another example, a high powered laser ablation process may be followed by a lower power laser ablation process.

When the via hole 332 is formed, residue 334 may remain within the via hole 332, such as on the surface of the passivation film 312. This residue 334 may be an incomplete removal of the build-up layer 322 within the via hole 332.

Figure 3E:
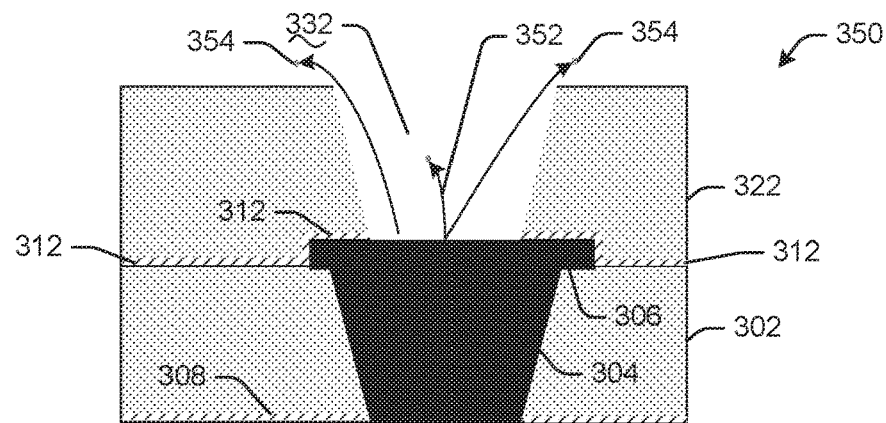

FIG. 3E depicts a simplified cross-sectional schematic diagram of an example interconnect structure 350 with the passivation layer 312 removed at the bottom of the via hole 332, in accordance with example embodiments of the disclosure.

A removal, such as an etch process, of the passivation layer 312 may be performed, instead of a desmear process, to remove the passivation layer 312 that is exposed at the bottom of the via hole. By etching the passivation layer, the residue 334 may be removed 352 as pieces of residue 334. The residue 334 may be loosened and released as particles 354, as the underlying passivation film 312 is etched away. This process may produce a relatively smoother metal 306 surface and of dielectric 322 surface compared to if a desmear process is performed. The relatively smoother dielectric surface may be realized on the sidewalls of the via hole and/or a top surface of the build-up dielectric 322. The passivation layer removal process may be any suitable removal process, such as a wet etch and/or a dry etch process. In some example embodiments, the passivation layer may be etched using a permanganate etch solution, a phosphoric acid solution, or indeed any suitable etch for removal of the passivation layer 312.

In some example embodiments, the passivation layer 312 at the bottom of the via hole 332 may be removed by a plasma etch process, such as a magnetically enhanced reactive ion etch (MERIE), high density plasma (HDP), or indeed any suitable plasma etch process. In some example embodiments, the build-up dielectric 322 may have filler materials, resins, and/or other elements to make the build-up dielectric 322 more resistant to plasma etching. Any suitable type of plasma system may be used including, but not limited to, capacitively-coupled, inductively-coupled, microwave plasma, upstream plasma, combinations thereof, or the like. Any suitable etch gases may be used, for example, fluorinated gases, such as tetrafluoromethane, hexafluoroethane, octafluoropropane, octafluorocyclobutane, herafluoro-1,3-butadiene, combinations thereof, or the like. Additionally, other gases for promoting polymerization and/or etching, as well as carrier gases may be used, such as oxygen, hydrogen, carbon dioxide, nitrogen, argon, helium, combinations thereof, or the like.

Figure 3F:
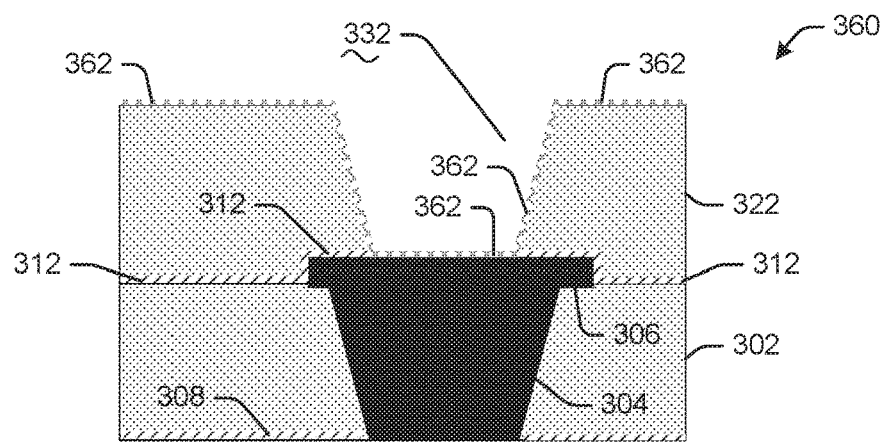

FIG. 3F depicts a simplified cross-sectional schematic diagram of an example interconnect structure 360 with an adhesion layer 362 formed over the build-up dielectric 322, in accordance with example embodiments of the disclosure.

After the passivation layer 312 is removed from the bottom of a via hole 332, an adhesion layer 362 may be deposited. The adhesion layer 362 may promote adhesion of subsequent plated metal in the via and metallic traces, such as those formed by a semi-additive process, to metal traces at the bottom of the via holes and/or build-up dielectrics. The adhesion layer may be deposited by any suitable process, such as PECVD. Alternatively, the adhesion layer may be deposited by any other suitable process, such as PVD, CVD, ALD, combinations thereof, or the like. The adhesion layer deposition process, in example embodiments, may be optimized to provide a relatively low temperature process (e.g., temperatures compatible with underlying build-up materials). In example embodiments, the adhesion layer 362 deposition process may further be optimized to provide a conformal coverage of the adhesion layer 362 within the via hole 332 and over the surface of the underlying build-up dielectric layer 322. The adhesion layer 362 may be any suitable material, including, for example, titanium, tantalum, tungsten, molybdenum, titanium nitride, tantalum nitride, cobalt, cobalt-tungsten-boron, alloys of the aforementioned, combinations thereof, or the like.

Figure 3G:
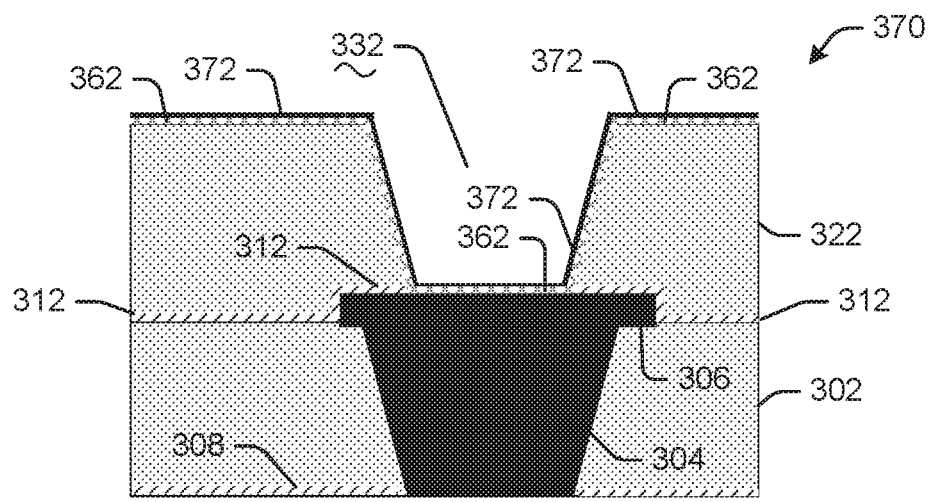

FIG. 3G depicts a simplified cross-sectional schematic diagram of an example interconnect structure 370 with a metal seed layer 372 formed over the adhesion layer 362, in accordance with example embodiments of the disclosure.

A metal seed layer 372 may be deposited over the adhesion layer 362, in example embodiments, by any suitable mechanism, such as an electroless plating process. The metal seed in some example embodiments, may be deposited by PVD, CVD, evaporation, ALD, combinations thereof, or the like. The metal seed layer may be copper, cobalt, aluminum, combinations thereof, or the like.

Figure 3H:
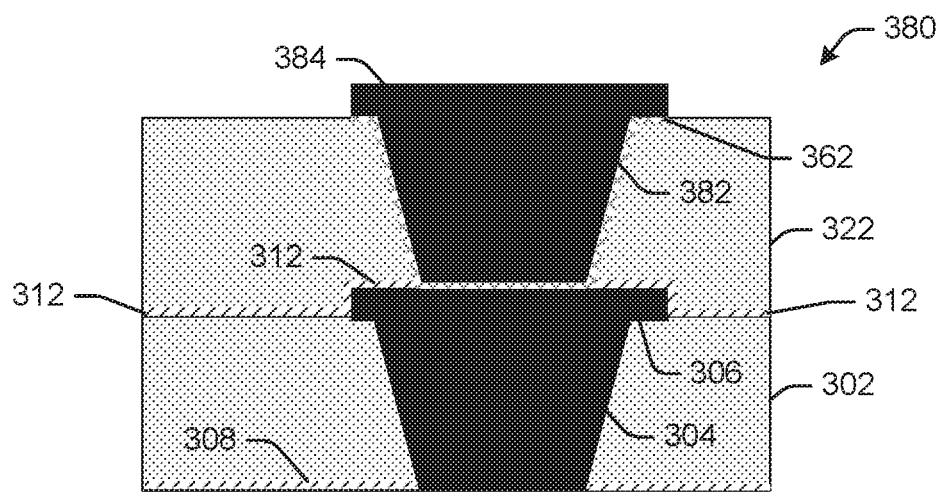

FIG. 3H depicts a simplified cross-sectional schematic diagram of an example interconnect structure 380 with passivated interconnects, in accordance with example embodiments of the disclosure.

After the seed layer 372 is deposited, vias and/or metal layers may be formed overlying the underlying metal trace and/or underlying build-up layer. This may be performed by a semi-additive process, or any other suitable process. For example, photoresist or other masking material may be deposited and patterned and then metal layers may be electroplated in the portions that may be exposed in the photoresist or other masking material. These exposed portions may provide a current path between the deposited seed layer and an electroplating solution in which the package substrate is selectively plated. As a result, metal may be plated in these exposed regions. The electroplating process may electroplate copper, cobalt, nickel, combinations thereof, or any other suitable metal, alloy thereof, or the like. After electroplating via and metal trace(s), the photoresist or other masking material may be stripped off of the surface of the packaging substrate on which the interconnect structure with passivated material and/or high density interconnect (HDI) is fabricated.

Figure 4:
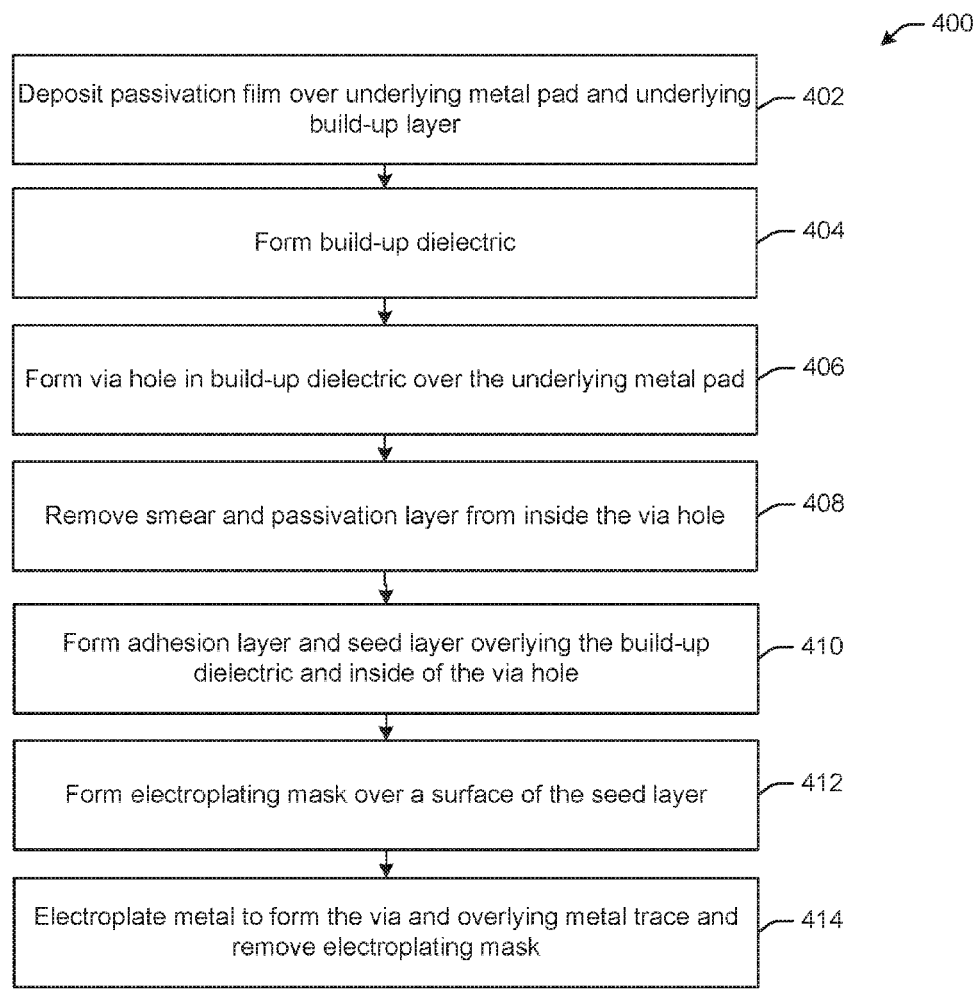
FIG. 4 depicts a flow diagram illustrating an example method for fabricating interconnects with a passivation layer, in accordance with example embodiments of the disclosure.

FIG. 4 depicts a flow diagram illustrating an example method 400 for fabricating interconnects with a passivation layer, in accordance with example embodiments of the disclosure. This method 400 may be used to fabricate any of the semiconductor packages with passivated interconnects, as depicted in the preceding figures. It will be appreciated that some processes may be performed in an order different from that depicted herein. It will further be appreciated that some processes may have suitable substitutes that may be implemented without deviating from embodiments of the disclosure.

At block 402, passivation film may be deposited over an underlying metal pad and underlying build-up layer. In some example embodiments, the passivation layer may be any suitable film, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, of the like. The passivation layer may be of any suitable thickness.

At block 404, build-up dielectric may be formed. The build-up layer may be formed on the underlying build-up dielectric and/or passivation layer using any suitable mechanism. In example embodiments, the build-up layer may be in the form of a sheet and may be laminated onto an underlying material, such as by applying heat and pressure (e.g., by heated rollers, etc.).

At block 406, a via hole may be formed in the build-up dielectric over the underlying metal pad. In example embodiments, the via holes in the build-up dielectric may be formed such that the bottom of the via holes open up to the underlying passivation layer overlying the metal trace. The via hole may be formed by any suitable mechanism including, but not limited to, laser ablation, wet etching, dry etching, embossing, combinations thereof, or the like.

At block 408, smear and passivation layer may be removed from inside the via hole. A removal, such as an etch process, of the passivation layer may be performed, instead of a desmear process, to remove the passivation layer that is exposed at the bottom of the via hole. By etching the passivation layer, the residue may be removed as pieces of residue. The residue may be loosened and released as particles, as the underlying passivation film is etched away. This process may produce a relatively smoother metal surface and of dielectric surface compared to if a desmear process is performed.

At block 410, an adhesion layer and seed layer may be formed overlying the build-up dielectric and inside the via holes. A metal seed layer may be deposited over the adhesion layer, in example embodiments, by any suitable mechanism, such as an electroless plating process. The metal seed in some example embodiments, may be deposited by PVD, CVD, evaporation, ALD, combinations thereof, or the like. The metal seed layer may be copper, cobalt, aluminum, combinations thereof, or the like.

A metal seed layer may be deposited over the adhesion layer, in example embodiments, by any suitable mechanism, such as an electroless plating process. The metal seed in some example embodiments, may be deposited by PVD, CVD, evaporation, ALD, combinations thereof, or the like. The metal seed layer may be copper, cobalt, aluminum, combinations thereof, or the like.

At block 412, an electroplating mask may be formed over a surface of the seed layer. Photoresist or other masking material may be deposited and patterned to define where metal layers may be electroplated in the portions that may be exposed in the photoresist or other masking material. In some example embodiments, spin-on or laminate photoresist may be used and exposed through a photomask with a light at a wavelength for which the photoresist is optically sensitive. In some cases, a hard mask may be used, where the hard mask may be any material that may be patterned with a photosensitive mask and then may remain on the surface of the semiconductor package for the purposes of defining the regions where electroplating may be performed.

At block 414, metal may be electroplated to form the via and overlying metal trace, and then the electroplating mask may be removed. Photoresist or other masking material may be deposited and patterned and then metal layers may be electroplated in the portions that may be exposed in the photoresist or other masking material. These exposed portions may provide a current path between the deposited seed layer and an electroplating solution in which the package substrate is selectively plated. As a result, metal may be plated in these exposed regions. The electroplating process may electroplate copper, cobalt, nickel, combinations thereof, or any other suitable metal, alloy thereof, or the like. After electroplating via and metal trace(s), the photoresist or other masking material may be stripped off of the surface of the packaging substrate on which the interconnect structure with passivated material and/or high density interconnect (HDI) is fabricated.

Although the method 400, in the interest of clarity, discusses the formation of a single via and metallic trace, it will be appreciated that any suitable plurality of vias and/or metallic traces may be formed with an underlying passivation film. It will further be appreciated that the method 400 may be repeated for subsequent interconnect build-up layers with passivation film.

It should be noted, that the method 400 may be modified in various ways in accordance with certain embodiments of the disclosure. For example, one or more operations of the method 400 may be eliminated or executed out of order in other embodiments of the disclosure. Additionally, other operations may be added to the method 400 in accordance with other embodiments of the disclosure.

Figure 5:
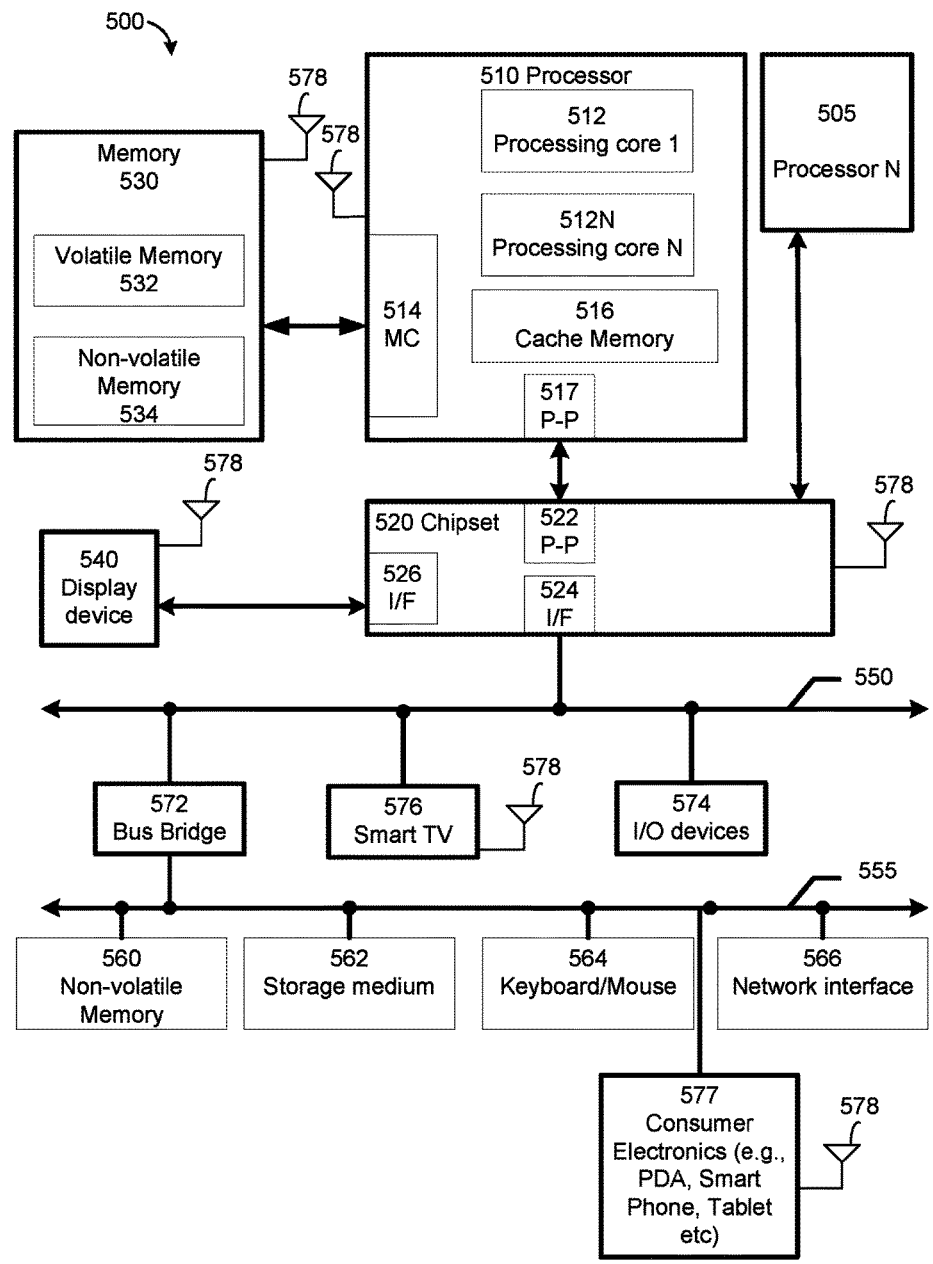
FIG. 5 depicts an example of a system in accordance with example embodiments of the disclosure.

FIG. 5 depicts an example of a system 500 according to one or more embodiments of the disclosure. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 can include a system on a chip (SOC) system.

In one embodiment, system 500 includes multiple processors including processor 510 and processor N 505, where processor 505 has logic similar or identical to the logic of processor 510. In one embodiment, processor 510 has one or more processing cores (represented here by processing core 512 and processing core 512N, where 512N represents the Nth processor core inside processor 510, where N is a positive integer). More processing cores can be present (but not depicted in the diagram of FIG. 5). In some embodiments, processing core 512 includes, but is not limited to, pre-fetch logic to fetch instructions, decode logic to decode the instructions, execution logic to execute instructions, a combination thereof, or the like. In some embodiments, processor 510 has a cache memory 516 to cache instructions and/or data for system 500. Cache memory 516 may be organized into a hierarchical structure including one or more levels of cache memory.

In some embodiments, processor 510 includes a memory controller (MC) 514, which is configured to perform functions that enable the processor 510 to access and communicate with memory 530 that includes a volatile memory 532 and/or a non-volatile memory 534. In some embodiments, processor 510 can be coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interface 517 and P-P interface 522. Chipset 520 enables processor 510 to connect to other elements in system 500. In some embodiments of the disclosure, P-P interface 517 and P-P interface 522 can operate in accordance with a PtP communication protocol, such as the Intel® QuickPath Interconnect (QPI) or the like. In other embodiments, a different interconnect may be used.

In some embodiments, chipset 520 can be configured to communicate with processor 510, 505N, display device 540, and other devices 572, 576, 574, 560, 562, 564, 566, 577, etc. Chipset 520 may also be coupled to the wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the disclosure, processor 510 and chipset 520 are integrated into a single SOC. In addition, chipset 520 connects to bus 550 and/or bus 555 that interconnect various elements 574, 560, 562, 564, and 566. Bus 550 and bus 555 may be interconnected via a bus bridge 572. In one embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In one embodiment, mass storage device(s) 562 can include, but not be limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 or selected elements thereof can be incorporated into processor core 512.

It is noted that the system 500 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-4), as disclosed herein, may be provided in any variety of electronic device including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a semiconductor package, including a first build-up dielectric layer with a first surface; a metal trace disposed over at least a first portion of the first surface, the metal trace having a second surface in contact with the first surface, and a third surface opposing the second surface; and a passivation layer disposed over at least a portion the first surface and over at least a portion of the third surface; a second build-up dielectric disposed over the passivation layer; and a via disposed in the second build-up dielectric and in electrical contact with the metal trace. In some example embodiments, the semiconductor package may further include an adhesion layer disposed between a sidewall of the via and the second build-up dielectric. In still further example embodiments, the second build-up layer includes a fourth surface and a fifth surface opposing the fourth surface, wherein the fourth surface is in contact with the passivation layer, and wherein the adhesion layer partially overlies the fifth surface. In yet further example embodiments, the adhesion layer includes at least one of: (i) titanium nitride; (ii) tantalum nitride; (iii) titanium; (iv) tantalum; (v) tungsten; (vi) molybdenum; (vii) cobalt; or (viii) nickel. In certain further example embodiments, the passivation layer includes at least one of: (i) silicon nitride; (ii) silicon dioxide; (iii) silicon oxynitride; (iv) silicon carbonitride; (v) silicon carbide; or (vi) porous silicate glass.

According to example embodiments, the metal trace is a first metal trace, and the semiconductor package includes a second metal trace, the second metal trace in contact with the via and at least partially overlying the second build-up layer. In some example embodiments, the semiconductor package may further include one or more package-to-board interconnects electrically coupled to the via. In further example embodiments, the semiconductor package may further comprise at least one electrical component disposed over the second build-up dielectric. In still further example embodiments, the passivation layer is a first passivation layer, and wherein the semiconductor package includes a second passivation layer, the second passivation layer at least partially overlying the second build-up layer. In yet further example embodiments, there is no passivation layer between the via and the metal trace.

According to example embodiments, there may be a method, comprising providing a passivation layer over a first build-up dielectric layer and a metal trace, the passivation layer having a first surface and a second surface opposing the first surface, wherein the first surface contacts the first build-up layer and the metal trace; providing a second build-up dielectric layer over the passivation layer, the second build-up dielectric layer having a third surface and a fourth surface opposing the third surface, wherein the fourth surface of the second build-up dielectric layer is in contact with the second surface of the passivation layer; forming a via hole in the second build-up dielectric layer, the via hole substantially extending from the third surface to the fourth surface; removing a portion of the passivation layer at a bottom of the via hole; and filling the via hole with via metal, wherein the via metal is electrically coupled to the electrical trace. In some example embodiments, providing a passivation layer includes depositing at least one of: (i) silicon nitride; (ii) silicon dioxide; (iii) silicon oxynitride; (iv)

silicon carbonitride; (v) silicon carbide; or (vi) porous silicate glass. In further example embodiments, providing a passivation layer includes depositing a silicon nitride layer by plasma enhanced chemical vapor deposition (PECVD). In still further example embodiments, the method further includes forming an adhesion layer partially overlying the third surface of the second build-up dielectric layer and a sidewall of the via hole. In yet further example embodiments, forming the adhesion layer comprises depositing at least one of: (i) titanium nitride; (ii) tantalum nitride; (iii) titanium; (iv) tantalum; (v) tungsten; (vi) molybdenum; (vii) cobalt; or (viii) nickel.

According to some example embodiments of the disclosure, forming the adhesion layer includes depositing the adhesion layer by at least one of: (i) chemical vapor deposition (CVD); (ii) plasma enhanced chemical vapor deposition (PECVD); (iii) physical vapor deposition (PVD); or (iv) atomic layer deposition (ALD). In further example embodiments, the method further includes forming metal seed layer over the adhesion layer. In still further example embodiment, the method includes forming a masking layer partially covering the seed layer and having one or more open portions where the metal seed layer is uncovered, wherein filling the via hole with metal comprises electroplating metal in the one or more open portions; removing the masking layer; and removing at least a portion of the seed layer and at least a portion of the adhesion layer. In yet further example embodiments, forming the via hole in the second dielectric build-up layer results in residual dielectric at the bottom of the via hole, wherein the removing the portion of the passivation layer at the bottom of the via hole includes removing the residual dielectric from the bottom of the via hole. In some example embodiments, removing the portion of the passivation layer at the bottom of the via hole includes at least one of: (i) a permanganate solution-based wet etch; (ii) a phosphoric acid solution-based wet etch; or (iii) a fluorinated plasma based etch.

The claimed invention is:

1. A semiconductor package, comprising:
   a first build-up dielectric layer disposed over at least a portion of a first passivation layer, the first build-up dielectric layer further having a first surface;
   a metal trace disposed over at least a first portion of the first surface, the metal trace having a second surface in contact with the first surface, and a third surface opposing the second surface;
   a second passivation layer disposed over at least a portion of the first surface and over at least a portion of the third surface, the second passivation layer comprising a different material than the first build-up dielectric layer;
   a second build-up dielectric layer disposed over the second passivation layer; and
   a via disposed in the second build-up dielectric and in electrical contact with the metal trace.

2. The semiconductor package of claim 1, further comprising an adhesion layer disposed between a sidewall of the via and the second build-up dielectric layer.

3. The semiconductor package of claim 2, wherein the second build-up dielectric layer includes a fourth surface and a fifth surface opposing the fourth surface, wherein the fourth surface is in contact with the second passivation layer, and wherein the adhesion layer partially overlies the fifth surface.

4. The semiconductor package of claim 2, wherein the adhesion layer comprises at least one of: (i) titanium nitride; (ii) tantalum nitride; (iii) titanium; (iv) tantalum; (v) tungsten; (vi) molybdenum; (vii) cobalt; or (viii) nickel.

5. The semiconductor package of claim 1, wherein the second passivation layer comprises at least one of: (i) silicon nitride; (ii) silicon dioxide; (iii) silicon oxynitride; (iv) silicon carbonitride; (v) silicon carbide; or (vi) porous silicate glass.

6. The semiconductor package of claim 1, wherein the metal trace is a first metal trace, and the semiconductor package includes a second metal trace, the second metal trace in contact with the via and at least partially overlying the second build-up dielectric-layer.

7. The semiconductor package of claim 1, further comprising one or more package-to-board interconnects electrically coupled to the via.

8. The semiconductor package of claim 1, further comprising at least one electrical component disposed over the second build-up dielectric layer.

9. The semiconductor package of claim 1 wherein the semiconductor package includes a third passivation layer, the third passivation layer at least partially overlying the second build-up dielectric layer.

10. The semiconductor package of claim 1, wherein there is no second passivation layer between the via and the metal trace.

11. A method, comprising:
    providing a first build-up dielectric layer disposed over at least a portion of a first passivation layer, the first build-up dielectric layer further having a first surface;
    providing metal trace disposed over at least a first portion of the first surface, the metal trace having a second surface in contact with the first surface, and a third surface opposing the second surface;
    providing a second passivation layer disposed over at least a portion of the first surface and over at least a portion of the third surface, the second passivation layer comprising a different material than the first build-up dielectric layer;
    providing a second build-up dielectric layer over the passivation layer; and
    forming a via disposed in the second build-up dielectric layer.

12. The method of claim 11, wherein the second passivation layer comprises at least one of: (i) silicon nitride; (ii) silicon dioxide; (iii) silicon oxynitride; (iv) silicon carbonitride; (v) silicon carbide; or (vi) porous silicate glass.

13. The method of claim 11, further comprising forming an adhesion layer disposed between the second build-up dielectric layer and a sidewall of the via.

14. The method of claim 13, wherein the adhesion layer comprises at least one of: (i) titanium nitride; (ii) tantalum nitride; (iii) titanium; (iv) tantalum; (v) tungsten; (vi) molybdenum; (vii) cobalt; or (viii) nickel.

15. The method of claim 13, wherein the second build-up dielectric layer includes a fourth surface and a fifth surface opposing the fourth surface, wherein the fourth surface is in contact with the second passivation layer, and wherein the adhesion layer partially overlies the fifth surface.

16. The method of claim 11, wherein the metal trace is a first metal trace, the method further comprising providing a second metal trace, the second metal trace in contact with the via and at least partially overlying the second build-up dielectric layer.

17. The method of claim 11, wherein the metal trace is a first metal trace, the method further comprising providing one or more package-to-board interconnects electrically coupled to the via.

18. The method of claim 11, the method further comprising providing at least one electrical component disposed over the second build-up dielectric layer.

19. The method of claim 11, wherein there is no second passivation layer between the via and the metal trace.

20. The method of claim 11, the method further comprising providing a third passivation layer, the third passivation layer at least partially overlying the second build-up dielectric layer.

* * * * *